United States Patent
Breslow et al.

(10) Patent No.: US 11,586,555 B2
(45) Date of Patent: Feb. 21, 2023

(54) FLEXIBLE DICTIONARY SHARING FOR COMPRESSED CACHES

(71) Applicant: Advanced Micro Devices, Inc., Santa Clara, CA (US)

(72) Inventors: Alexander D. Breslow, Sunnyvale, CA (US); John Kalamatianos, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/231,957

(22) Filed: Apr. 15, 2021

(65) Prior Publication Data

US 2021/0232505 A1 Jul. 29, 2021

Related U.S. Application Data

(63) Continuation of application No. 16/544,468, filed on Aug. 19, 2019, now Pat. No. 10,983,915.

(51) Int. Cl.
 G06F 12/0895 (2016.01)
 H03M 7/30 (2006.01)

(52) U.S. Cl.
 CPC ...... G06F 12/0895 (2013.01); H03M 7/3088 (2013.01); *G06F 2212/1044* (2013.01); *G06F 2212/608* (2013.01)

(58) Field of Classification Search
 CPC ............ G06F 12/0895; G06F 12/0893; G06F 12/0877; G06F 12/0871; G06F 12/0864; G06F 12/0802; G06F 2212/1044; G06F 2212/608; H03M 7/3088
 See application file for complete search history.

(56) References Cited

U.S. PATENT DOCUMENTS

| 9,703,796 | B2 | 7/2017 | Kumar et al. |
| 10,264,103 | B2 | 4/2019 | Schurman et al. |
| 10,311,029 | B2 | 6/2019 | Fabijancic et al. |
| 10,983,915 | B2 | 4/2021 | Breslow et al. |
| 2003/0131184 | A1 | 7/2003 | Kever |

(Continued)

OTHER PUBLICATIONS

International Search Report and Written Opinion in International Application No. PCT/US2020/047029, dated Dec. 2, 2020, 12 pages.

(Continued)

*Primary Examiner* — Michael Krofcheck
(74) *Attorney, Agent, or Firm* — Kowert Hood Munyon Rankin and Goetzel PC; Rory D. Rankin

(57) ABSTRACT

Systems, apparatuses, and methods for implementing flexible dictionary sharing techniques for caches are disclosed. A set-associative cache includes a dictionary for each data array set. When a cache line is to be allocated in the cache, a cache controller determines to which set a base index of the cache line address maps. Then, a selector unit determines which dictionary of a group of dictionaries stored by those sets neighboring this set would achieve the most compression for the cache line. This dictionary is then selected to compress the cache line. An offset is added to the base index of the cache line to generate a full index in order to map the cache line to the set corresponding to this chosen dictionary. The compressed cache line is stored in this set with the chosen dictionary, and the offset is stored in the corresponding tag array entry.

20 Claims, 14 Drawing Sheets

(56) References Cited

U.S. PATENT DOCUMENTS

| | | | |
|---|---|---|---|
| 2004/0139298 A1* | 7/2004 | Holloway | G06F 9/3808 |
| | | | 712/210 |
| 2005/0071562 A1 | 3/2005 | Adl-Tabatabai et al. | |
| 2006/0106870 A1 | 5/2006 | Franaszek et al. | |
| 2011/0271055 A1 | 11/2011 | O'Connor | |
| 2015/0032850 A1* | 1/2015 | Talyansky | H04L 67/2842 |
| | | | 709/218 |
| 2015/0178305 A1* | 6/2015 | Mueller | G06F 16/17 |
| | | | 707/693 |
| 2015/0381201 A1 | 12/2015 | Ansari et al. | |
| 2017/0285960 A1* | 10/2017 | Yap | G06F 12/00 |
| 2017/0286313 A1* | 10/2017 | Jiang | G06F 12/0864 |
| 2018/0217777 A1* | 8/2018 | Jiang | G06F 3/0608 |

OTHER PUBLICATIONS

Panda et al., "Dictionary sharing: An efficient cache compression scheme for compressed caches", 2016 49th Annual IEEE/ACM International Symposium on Microarchitecture (MICRO), Oct. 15, 2016, 12 pages.

Zeng et al., "Data Locality Exploitation in Cache Compression", 2018 IEEE 24th International Conference on Parallel and Distributed Systems (ICPADS), Dec. 11, 2018, pp. 347-354.

* cited by examiner

FLEXIBLE DICTIONARY SHARING FOR COMPRESSED CACHES

CROSS REFERENCE TO RELATED APPLICATIONS

This application is a continuation of U.S. patent application Ser. No. 16/544,468, entitled "FLEXIBLE DICTIONARY SHARING FOR COMPRESSED CACHES", filed Aug. 19, 2019, the entirety of which is incorporated herein by reference.

BACKGROUND

Description of the Related Art

A microprocessor may be coupled to one or more levels of a cache hierarchy in order to reduce the latency of the microprocessor's request of data in memory for a read or a write operation. Cache subsystems in a computing system include high-speed cache memories that store blocks of data. Generally, a cache may store one or more blocks, each of which is a copy of data stored at a corresponding address in the system memory. As used herein, a "cache line" or "cache block" is a set of bytes stored in contiguous memory locations, which are treated as a unit for coherency purposes. In some embodiments, a cache line can also be the unit of allocation and deallocation in a cache. The number of bytes in a cache line is varied according to design choice and can be of any size.

Cache capacity is a crucial resource in any high-performance architecture design. One can use larger caches to gain more capacity, but this approach incurs higher access latency and consumes more power and area. Cache compression techniques reduce the area cost per megabyte (MB) of cache and thereby allow reducing area or increasing cache capacity.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

Figure 1:
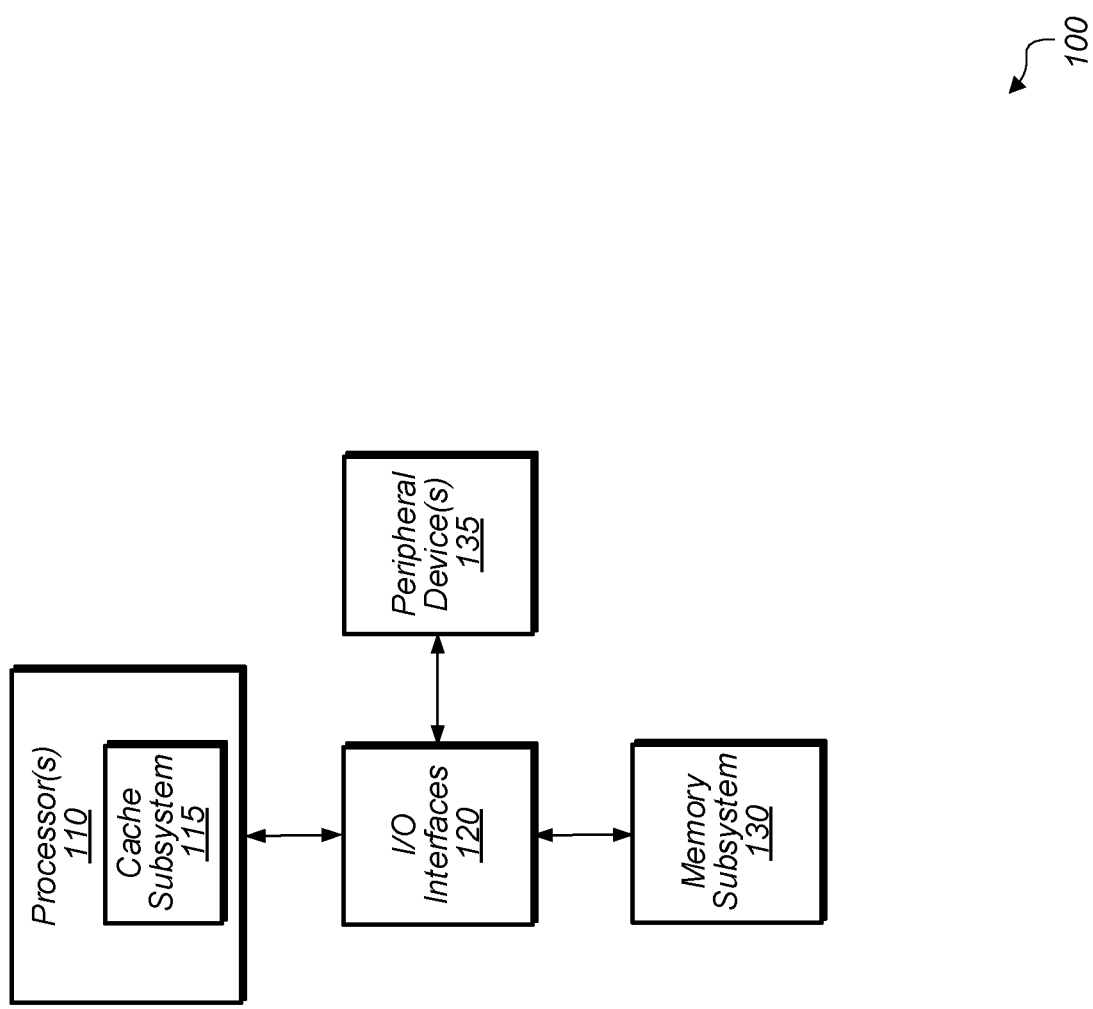
FIG. 1 is a block diagram of one implementation of a computing system.

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems, apparatuses, and methods for implementing flexible dictionary sharing techniques for compressed cache subsystems are disclosed herein. A compressed cache includes at least a cache controller, a dictionary selector unit, a tag array, and a data array. In one implementation, each entry in the tag array has an offset field in addition to a metadata field and a tag field. When a cache line is to be allocated in the compressed cache, a base index of the address of the cache line is used to map the cache line to a corresponding entry of the tag array. In one implementation, each set of the data array potentially stores a dictionary which can be used to compress cache lines of the set. The dictionary is typically allocated only if the dictionary can adequately compress enough cache lines to offset its cost. If none of the cache lines in a set are compressible, then in one implementation, the dictionary will not get allocated.

As used herein, the term "dictionary" is defined as a group of distinct reference data chunk entries, where each reference data chunk is a fraction (i.e., portion) of the size of a cache line. Typically, the number of bytes in a reference data chunk is a factor of the number of bytes in a cache line, allowing a cache line to be partitioned into some integer number of data chunks. The number of reference data chunk entries and the size of a reference data chunk can vary from dictionary to dictionary. The reference data chunk entries include commonly occurring data patterns that are likely to be detected within the cache lines stored by the compressed cache. For example, all 0's or all 1's are commonly occurring data patterns, and these can be two of the reference data chunks in a given dictionary. When a cache line is compressed using a dictionary, pointer fields are stored in place of the original data of the cache line, with each pointer field pointing to a reference data chunk entry (within a dictionary) which matches that particular portion of the original data of the cache line. In one implementation, the dictionary is stored together with the compressed cache line in the data array, while in another implementation, the dictionary is stored in a dictionary table which is a separate structure from the data array.

In one implementation, each set of a set-associative cache potentially includes a dictionary for compressing cache lines stored in the respective set if the cache lines stored in the respective set are compressible. In this implementation, when allocating space for new data to be stored in the compressed cache, such as for a cache line fill following a cache miss, control logic modifies the set mapping of the cache line to cause the cache line to be mapped to a given set containing a dictionary which is able to achieve a threshold amount of compression for the new data. In one implementation, the set mapping of the cache line is modified by adding an offset to the set index portion (i.e., base index) of the address corresponding to the cache line. In one example scenario, the original set index portion of an address would cause the cache line to be mapped to a first set with a first dictionary unable to achieve a threshold amount of compression. Rather than allocating this cache line in the first set, an offset is added to the set index portion of the address, causing the cache line to be mapped to a second set with a second dictionary which is able to achieve the threshold amount of compression. In this scenario, the cache line is compressed using the second dictionary, the compressed cache line is stored in the second set, and the offset is stored in the tag array entry corresponding to the compressed cache line.

In one implementation, in order to determine which offset to add to the set index portion (i.e., base index), a dictionary selector unit examines the compressibility of the cache line based on using different dictionaries of a subset of potential candidate dictionaries to compress the cache line. The selector unit determines which of the subset of potential candidate dictionaries will achieve at least a threshold compression ratio for compressing the cache line. Then, the cache line is compressed with the selected dictionary and the set mapping is modified to cause the cache line to be mapped to the set which stores the selected dictionary.

The offset field of the tag array entry allows for modifying the mapping of a cache line to a set of the data array where the associated dictionary can yield a better compression ratio. This approach is geared at improving cache line compressibility by improving data value locality within a set by modifying the mapping of cache lines to sets. Contrary to prior approaches which have limited ability to exploit data value locality, this approach works by looking at a larger number of cache lines creating greater opportunity to find redundancy. Cache lines' set mappings are modified such that cache lines with shared data value locality that would ordinarily map to neighboring cache sets instead map to the same set and can thus use the same dictionary. Absent this dictionary sharing approach, cache lines within a set are expected to have less inter-line data value locality, which leads to lower expected compressibility and a smaller effective cache size.

In another implementation, the compressed cache maintains an array of dictionaries for compressing cache lines, with each dictionary from the array able to be used by any cache line in the compressed cache. The array of dictionaries can also be referred to herein as a "dictionary table". In this implementation, each entry in the dictionary table is a dictionary that can be shared among multiple cache lines from different sets. Also, each entry in the dictionary table includes a reference count to track how many different cache lines are using (i.e., have been compressed with) this dictionary. In this implementation, each tag entry includes a dictionary identifier (ID) field that points to the dictionary in the dictionary table that is used to compress and decompress the cache line. In this implementation, when a cache line is going to be allocated in the compressed cache, selector logic determines, based on the data of the cache line, which of the dictionaries from the dictionary table to evaluate for potentially compressing the cache line. In one implementation, the dictionary which results in a highest compression ratio is chosen for compressing the cache line, and then an ID of this dictionary is stored in the dictionary ID field of the corresponding tag array entry.

The rationale behind this approach is that there are many cache lines in the compressed cache with similar data values. Rather than sharing a dictionary only at the level of a set, instead the compressed cache maintains an array of dictionaries for general use. This allows a dictionary to be shared among many cache lines within a slice of the compressed cache. Each tag array entry then stores a dictionary ID, which specifies which dictionary should be used to decompress the associated data. Additionally, in one implementation, the compressed cache includes logic to free and reallocate dictionary entries when a dictionary's reference count goes to zero. Generally speaking, the techniques described herein allow for an increased compressibility of cache lines as compared to the prior art.

Referring now to FIG. 1, a block diagram of one implementation of a computing system 100 is shown. In one implementation, computing system 100 includes at least processor(s) 110, input/output (I/O) interfaces 120, memory subsystem 130, and peripheral device(s) 135. In other implementations, computing system 100 can include other components, computing system 100 can omit an illustrated component, and/or computing system 100 can be arranged differently. In one implementation, each processor 110 includes a cache subsystem 115. Cache subsystem 115 has any number of cache levels with any of various types of caches which can vary according to the implementation. In some cases, one or more caches in the cache hierarchy of cache subsystem 115 can be located in other locations external to processor(s) 110. In one implementation, one or more caches of cache subsystem 115 are compressed caches, with these compressed caches including cache dictionaries which are used to compress the cache lines stored in the compressed caches. More details on the techniques used for employing cache dictionaries in a flexible manner will be provided throughout the remainder of this disclosure.

Processors(s) 110 are representative of any number and type of processing units (e.g., central processing unit (CPU), graphics processing unit (GPU), digital signal processor (DSP), field programmable gate array (FPGA), application specific integrated circuit (ASIC)). Memory subsystem 130 includes any number and type of memory devices. For example, the type of memory in memory subsystem 130 can include high-bandwidth memory (HBM), non-volatile memory (NVM), Dynamic Random Access Memory (DRAM), Static Random Access Memory (SRAM), NAND Flash memory, NOR flash memory, Ferroelectric Random Access Memory (FeRAM), or others. I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral device(s) 135 can be coupled to I/O interfaces 120. Such peripheral device(s) 135 include (but are not limited to) displays, keyboards, mice, printers, scanners, joysticks or other types of game controllers, media recording devices, external storage devices, network interface cards, and so forth.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components not shown in FIG. 1. Additionally, in other implementations, computing system 100 is structured in other ways than shown in FIG. 1.

Figure 2:
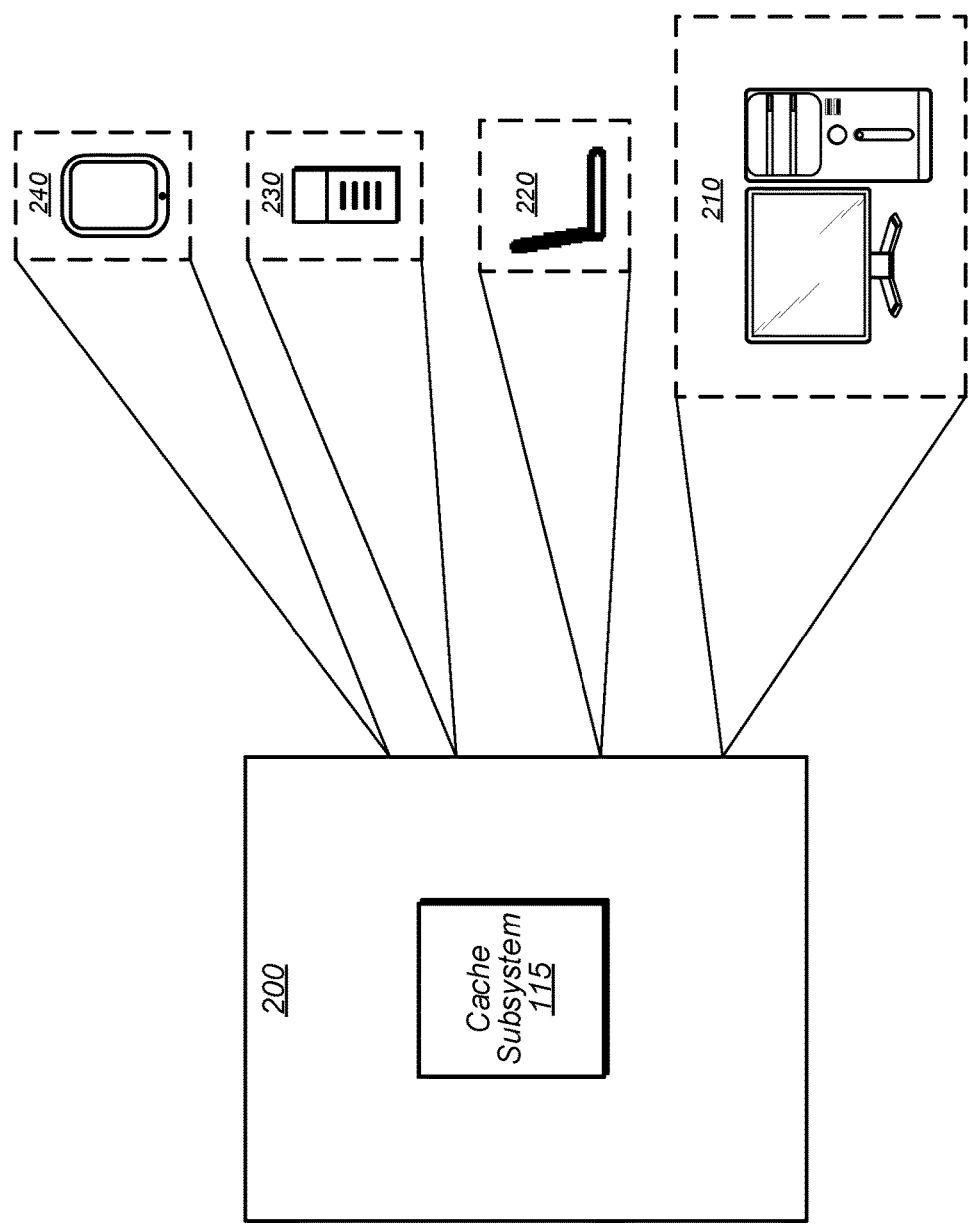
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes at least one instance of cache subsystem 115 (of FIG. 1). Although not shown in FIG. 2, system 200 can also include any number and type of other components, such as one or more processors, one or more memory devices, one or more peripheral devices, and so on. Cache subsystem 115 includes any number of cache levels which include flexibly-shared dictionaries for compressing commonly used data patterns among the data stored therein. More details regarding the flexible sharing of dictionaries in compressed caches will be provided throughout the remainder of this disclosure.

Figure 3:
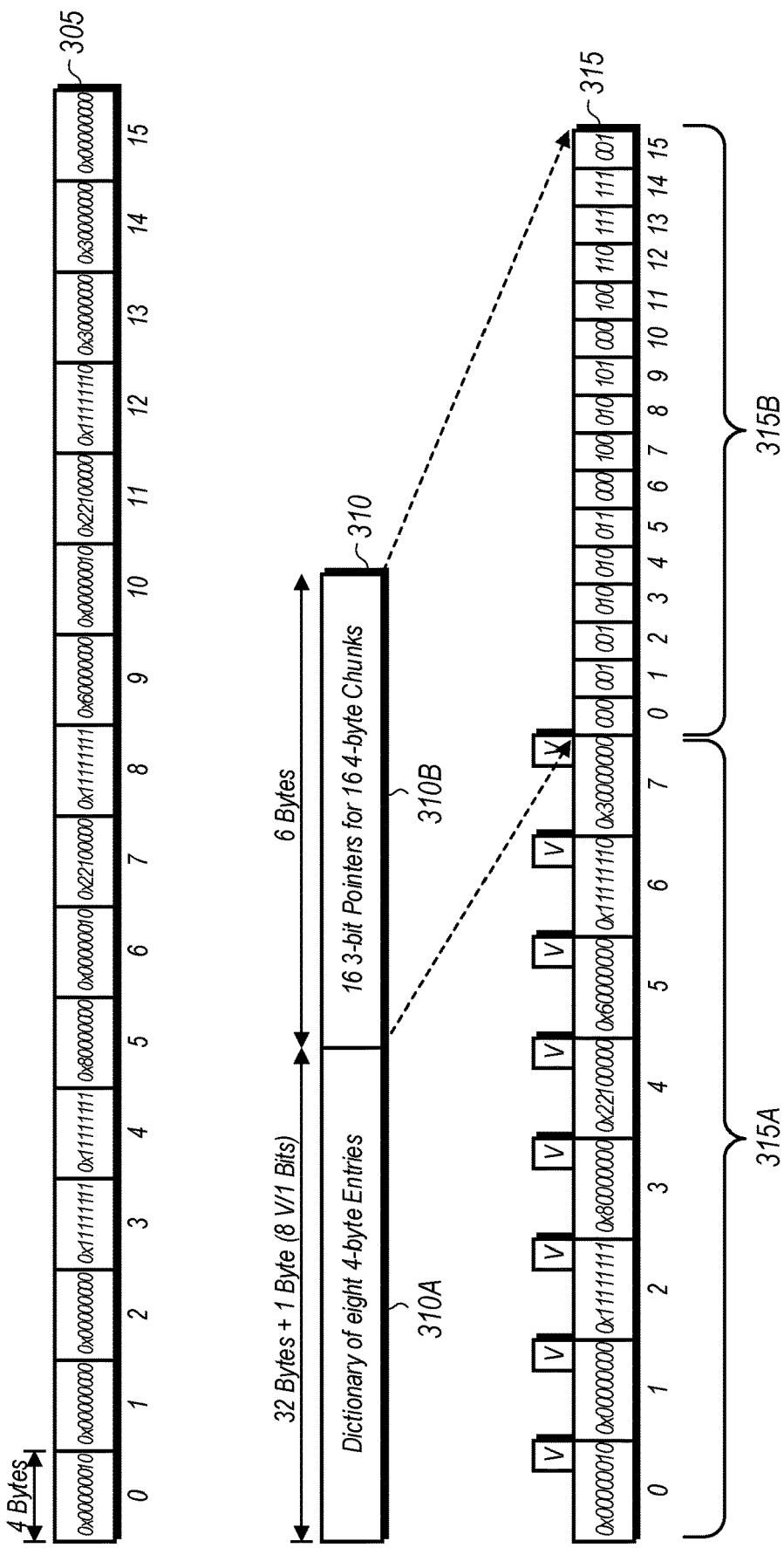
FIG. 3 is a diagram of a prior art implementation of using a dictionary to compress a cache line.

Referring now to FIG. 3, a diagram illustrating the use of a dictionary to compress a cache line is shown. An example cache line 305 is shown at the top of FIG. 3. It should be understood that the size of cache line 305 and the actual data of cache line 305 are indicative of one specific implementation. In other implementations, other sizes of cache lines can be employed and/or other data will be stored in the cache line. For the implementation illustrated in FIG. 3, cache line 305 has 64 bytes of data, with 16 separate four-byte chunks labeled 0-15.

In one implementation, in order to reduce the amount of data that is stored in the cache for a given cache line, the cache line is compressed using a dictionary. One example of a dictionary format 310 is shown in the middle of FIG. 3. Dictionary format 310 has a dictionary field 310A and a pointer field 310B which points to the dictionary entries for the individual chunks of a cache line. In one implementation, dictionary format 310 includes eight separate four-byte entries with a valid bit for each of these eight entries.

For cache lines of the size of cache line 305, pointer field 310B has 16 three-bit pointers for the 16 four-byte chunks of the cache line. Each three-bit pointer points to one of the eight dictionary entries. It should be understood that in other implementations, for other dictionaries with other numbers of entries, the number of bits per pointer will vary. For example, for a dictionary with four entries, each pointer will have two bits. It is noted that the number of entries in a dictionary can vary according to the implementation.

At the bottom of FIG. 3, compressed cache line 315 is shown with an actual dictionary 315A and the actual pointer values of pointer field 315B for the data of cache line 305. A typical dictionary includes entries for commonly occurring patterns which are likely to be found in the cached data of the computing system. The patterns shown in the entries of actual dictionary 315A are examples of the commonly occurring patterns of cache line 305. The data of cache line 305 is highly compressible since the 16 four-byte chunks of original data are able to be mapped to the eight four-byte entries of dictionary 315A. For some cache lines, however, the data might not be as compressible, and these cache lines can be stored in an uncompressed manner. A dictionary is not allocated in the cases where cache lines are stored in an uncompressed manner.

Figure 4:
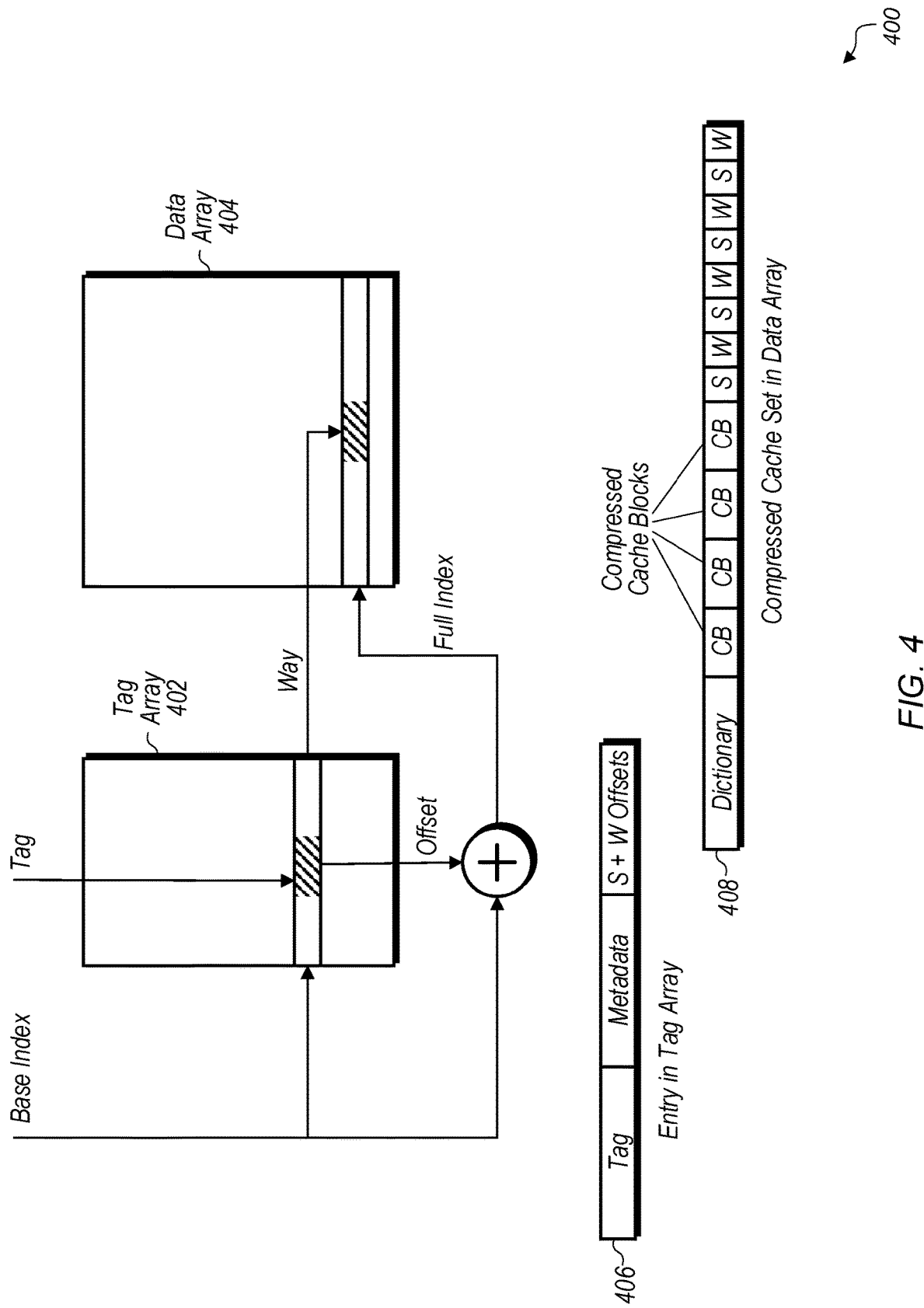
FIG. 4 is a block diagram of one implementation of a compressed cache employing flexible mapping between sets.

Turning now to FIG. 4, a block diagram of one implementation of a compressed cache 400 employing flexible mapping between sets is shown. In various implementations, compressed cache 400 is a low latency, high bandwidth memory separate from system memory. In some implementations, compressed cache 400 is used as a last-level cache in a cache memory subsystem (e.g., cache subsystem 115 of FIG. 1). In other implementations, compressed cache 400 is another level within the cache memory subsystem. While the example of using a dictionary to compress a single cache line was illustrated in FIG. 3, compressed cache 400 of FIG. 4 is able to compress multiple cache lines using a single dictionary. Also, compressed cache 400 includes multiple dictionaries, and in at least one implementation where compressed cache 400 is a set-associative cache, compressed cache 400 includes a dictionary for each set. In some cases, if the data of a set is not compressible, then that set can store the cache lines in an uncompressed state and not store a dictionary.

In one implementation, each set in data array 404 includes a dictionary that is used to compress and decompress the cache lines stored in the ways of the set. In some cases, the dictionary is shared among a group of cache lines where the group is less than a full set. Sharing the dictionary allows for the dictionary to be bigger, which often results in improved compression ratios per cache line and for more cache lines to be compressed. This sharing also amortizes the cost of storing the dictionary over more cache lines. A drawback of this scheme is that the sharing of the dictionary among the cache lines of the set is based on there being data value locality among cache lines within the set. If insufficient data value locality exists among the sets of data array 404, then the scheme is ineffective.

Accordingly, to increase the probability of achieving data value locality, the scheme illustrated for compressed cache 400 allows for selecting the best dictionary from among multiple candidate dictionaries when compressing each cache line. This approach of selecting a candidate dictionary from multiple dictionaries often produces improved data value locality as compared to the approach of simply using the dictionary of the set where the cache line maps based on the original set index portion of its address. The scheme illustrated in FIG. 4 will often be able to improve the compression ratio for compressed cache 400 (as compared to traditional approaches) because the scheme allows for effectively exploiting data locality among a larger number of cache lines. As used herein, the term "data value locality" is defined as multiple pieces of data within an application having the same, similar, or numerically clustered data values. By examining a larger number of dictionaries for compressing a given cache line, the likelihood of finding redundancy is greater.

As shown in FIG. 4, entry 406 of tag array 402 has an offset field in addition to the metadata and tag fields. In one implementation, the offset field in entry 406 stores a set offset and a way offset. In one implementation, the set offset is added to a base index to generate the full index. In another implementation, a logical exclusive OR (XOR) operation is performed between the base index and the set offset to generate the full index. As used herein, the term "base index" is defined as a portion of bits from a virtual or physical memory address. The base index refers to a virtual memory address if compressed cache 400 is a virtually indexed, physically tagged (VIPT) cache, or the base index refers to a physical memory address if compressed cache 400 is a physically indexed, physically tagged (PIPT) cache. The full index is used to map the cache line to a set in data array 404. The offset allows for cache lines to be mapped to a neighboring set where the associated dictionary can yield a better compression ratio. Additionally, the way offset allows for cache lines to be mapped to a different way within the set.

One example of a set 408 in data array 404 is shown on the bottom-right of FIG. 4, with set 408 including a dictionary, compressed cache blocks, and set (S) and way (W) offsets for each compressed cache block. The way offset is used in implementations when the way at which a tag is stored in tag array 402 is not the same as the associated cache line's way in data array 404. On an eviction from data array 404, the set and address information for the associated tag is computed by applying the set and way offsets. For example, in one implementation, an XOR operation of the set offset with the data array set is performed to determine the set of the associated tag. Also, in this implementation, an XOR operation of the way offset with the data array way is performed to determine the way of the associated tag. In other implementations, other types of operations can be performed using the set offset and way offset so as to calculate the set and way, respectively, of the associated tag. It is noted that the terms "cache block" and "cache line" are used interchangeably herein. While four compressed cache blocks are shown in set 408, it should be understood that this is merely shown as an example in accordance with one implementation. In other implementations, other numbers of compressed cache blocks can be stored in set 408. In one implementation, each compressed cache block in set 408 includes a plurality of pointer fields (e.g., pointer fields 315B of FIG. 3) which point to entries in the corresponding dictionary.

In one implementation, when a given cache line is going to be allocated in compressed cache 400, control logic (not shown) examines multiple different cache dictionaries from neighboring sets for compressing the given cache line. As used herein, the terms "neighbor" or "neighboring" are defined as the sets to which a given cache line is able to be mapped based on a value of an offset of the full cache line index that includes a base index and offset. In other words, the neighbors of a set include those sets that are addressable by changing a value of the offset. For example, by adding, concatenating, or XORing a base index of the given cache line with an offset, a given number of resulting addresses is possible depending on the value of the offset. These addresses identify a given neighborhood of sets. The size of the "neighborhood" is determined by the number of bits in the offset. For example, a one-bit offset would create a neighborhood of two sets (i.e., two different addresses corresponding to two different sets), a two-bit offset would create a neighborhood of four sets, a three-bit offset would create a neighborhood of eight sets, and so on. The compressibility of the data of the given cache line is determined for these multiple different cache dictionaries from neighboring sets. Then, the cache dictionary that achieves the most compression out of these multiple dictionaries for the given cache line is chosen. Alternatively, a cache dictionary that achieves more than a threshold amount of compression is chosen for the given cache line. In some cases, multiple dictionaries may achieve more than the threshold amount of compression, and the control logic can select any of these multiple dictionaries. It is noted that in some cases, the control logic chooses not to compress a cache line if the data of the cache line does not match well with any of the available dictionaries. In these cases, the cache line is stored in an uncompressed state. In one implementation, the control logic determines whether the cache line matches with a dictionary based on whether the size of the compressed version of the cache line using this dictionary is less than a threshold.

When the control logic determines that one of the dictionaries is a good match for a cache line, the control logic compresses the cache line with this particular dictionary. Also, a set offset is calculated such that when the set offset is added to (or XOR'd with) the base index to create a full index, the full index is the cache index of the set which has this particular dictionary. The set offset can have any number of bits, with the number of bits varying according to the implementation. Increasing the number of bits in the set offset allows for testing a greater number of dictionaries and mapping to a wider neighborhood of sets. However, in some implementations, there may be a practical limitation on the number of dictionaries that can be tested for each cache line based on power consumption limitations, area budgets, and latency constraints for both the cache arrays and selector unit(s) that perform(s) the comparisons.

Figure 5:
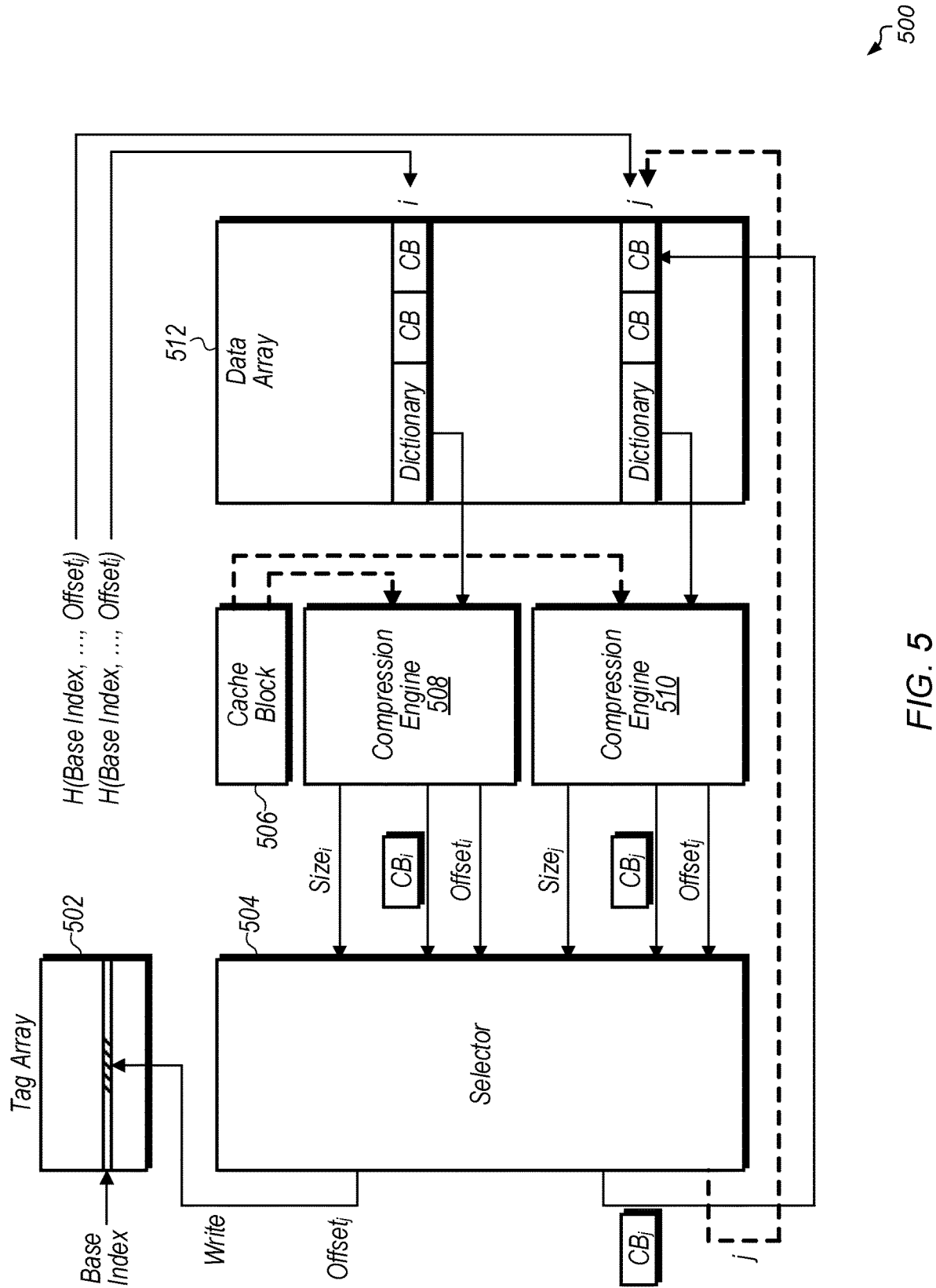
FIG. 5 is a block diagram of one implementation of a compressed cache.

Referring now to FIG. 5, a block diagram of one implementation of a compressed cache 500 is shown. Compressed cache 500 illustrates another example of using dictionaries in a flexible manner to achieve greater compression compared to traditional non-flexible approaches. In one implementation, the components of compressed cache 500 are included within one or more of the levels of cache subsystem 115 (of FIG. 1). It is noted that in some cases, only part of a level of a cache hierarchy is compressed. For example, a hybrid cache can include a first portion that is optimized for capacity using compression and a second portion that is optimized for latency. It is assumed for the purposes of this discussion that a cache block 506 is going to be allocated in compressed cache 500. Accordingly, multiple compression engines 508 and 510 compress the data of cache block 506 and convey the compressed cache blocks (e.g., $CB_i$) and size indicators (e.g., $Size_i$) to selector unit 504. It should be understood that while two compression engines 508 and 510 are shown in FIG. 5, in other implementations, other numbers of compression engines can compress cache block 506 to find out which compression engine achieves the most compression for cache block 506.

In one implementation, selector unit 504 determines which dictionary of the dictionaries used by compression engine 508 or 510 achieves the most compression for cache block 506. Then, selector unit 504 generates an offset that when added to the base index results in cache block 506 being mapped to the appropriate set in data array 512 that stores the selected dictionary. This offset is stored in the tag entry for cache block 506 in tag array 502. Also, the compressed version of cache block 506 is written to a way in the set of data array 512 that stores the selected dictionary. The function H() at the top of FIG. 5 is representative of one implementation of using a hash function to perform the mapping of the base index and offset to the appropriate set in data array 512. Other implementations can use other techniques for modifying the set mapping of cache blocks. The dashed line going from selector unit 504 to the "j" set of data array 512 indicates that this is the chosen set for storing the compressed version ($CB_j$) of cache block 506. It is assumed for the purposes of this discussion that the dictionary in set "j" achieved more compression than the other dictionary in set "i".

In some implementations, the placement of the cache line can be additionally modified within the set. For example, the tag can appear in way 1 of tag array 502 while the cache line appears in way 2 of data array 512. An additional metadata field similar to the offset field can be added to the metadata associated with the tag to track this modification. In some cases, cache lines do not move across sets once they are installed. In other cases, there are additional wires and logic to enable cache lines to migrate between neighboring sets when a cache line is updated on certain writes. When the cache line migrates, the offset field associated with its tag is updated so that the cache line can be retrieved on a subsequent access. Remapping of lines between sets can occur when a write to a cache line affects its compressibility when using its existing dictionary. In that case, rather than evicting data from the current set to handle the increase in capacity, cache logic checks if a dictionary from a neighboring set would be preferred for compressing the updated cache line based on a cost-benefit analysis. If the analysis determines that the dictionary from a neighboring set is a better choice than the original dictionary for compressing the updated cache line, then the updated cache line is remapped to the neighboring set. In one implementation, these remappings are constrained to a small neighborhood (i.e., to a threshold number of sets) so as to simplify the logic and complexity of compressed cache 500.

In one implementation, when a read is performed to compressed cache 500, a lookup of tag array 502 is performed first to find the tag entry corresponding to the targeted cache line. If the lookup to tag array 502 is a hit, then the offset is retrieved from the matching entry. Next, the offset is added to the base index to create a full index, and the full index is used to locate the corresponding set in data array 512. The dictionary is retrieved from the set and the compressed block is located and retrieved from the corresponding way. The dictionary is then used to decompress the compressed block into the original data which is returned to the requestor.

In some scenarios, a large plurality of cache lines in compressed cache 500 will not be amenable to compression. In these scenarios, compressed cache 500 is able to use the same area within data array 504 to store data in multiple formats. If compression is not possible, data array 512 stores uncompressed cache lines. When compression is possible, the same space stores a dictionary followed by multiple compressed blocks. Thus, there is no cost to store the dictionary when compression is not feasible.

Figure 6:
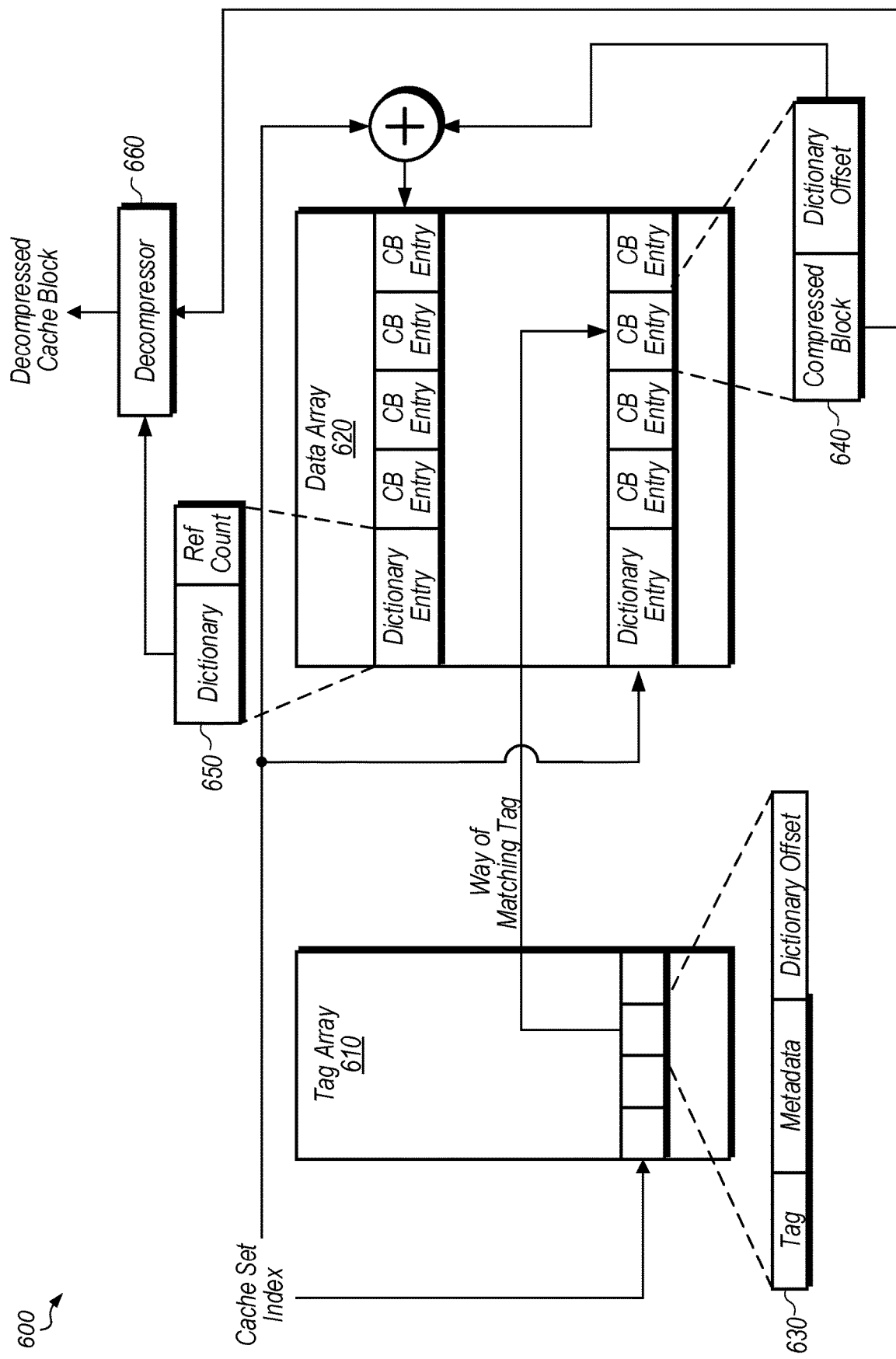
FIG. 6 is a block diagram of one implementation of a compressed cache.

Turning now to FIG. 6, a block diagram of one implementation of a compressed cache 600 is shown. FIG. 6 illustrates another way of using dictionaries in a compressed cache 600. In one implementation, the components of compressed cache 600 are included within one or more of the levels of cache subsystem 115 (of FIG. 1). In compressed cache 600, the cache set index portion of an address is used to index into tag array 610 and data array 620. Accordingly, the cache set and way is the same among tag array 610 and data array 620 as is found in a standard cache. An example of a tag array entry 630 is shown with a tag field, metadata field, and optional dictionary offset field. It is noted that accesses to data array 620 can still be serialized even in those implementations where the tag array entry 630 does not include a dictionary offset field.

The way of the matching tag in tag array 610 is used to locate the way in data array 620. An example cache block entry 640 is shown with a compressed block field and a dictionary offset field. The compressed block from the matching entry is provided to decompressor 660. The dictionary offset field is combined with the cache set index to locate the set in data array 620 that stores the dictionary which was used to compress the compressed block. In one implementation, the dictionary offset field is XOR'd with the cache set index to locate the appropriate set of data array 620. In other implementations, other ways of applying the dictionary offset field to the cache set index to index into data array 620 are possible and are contemplated. An example dictionary entry 650 is shown with a dictionary field and a reference count field. The dictionary is provided to decompressor 660 to decompress the compressed block. The reference count field tracks the number of compressed blocks that were compressed using the corresponding dictionary.

In the example shown with cache 600, a dictionary in a neighboring set in data array 620 is allowed to be used to compress cache blocks in a local set. In this example, the cache set index is shared between tag array 610 and data array 620. The dictionary is reference counted for each cache block that uses it for data compression. When a cache access is performed, the cache set index is used to index into tag array 610 and data array 620. When the lookup of tag array 610 results in a match, the way of the matching tag is forwarded to data array 610 and the associated compressed cache block is accessed. A dictionary offset from data array 610, which is co-located with the compressed cache block, specifies the relative set that stores the dictionary that was used to compress it. The associated dictionary is accessed in the appropriate set. Then, the dictionary (or a subset thereof) is provided to decompressor 660 in conjunction with the compressed block. Next, decompressor 660 outputs the associated decompressed cache block. As an optimization, a redundant copy of the dictionary offset can be stored in tag array 610. This redundant copy permits accessing the set containing the dictionary and the other set containing the compressed cache block in parallel. In another implementation, a single copy of the dictionary offset could be stored in tag array 610 and the redundant copy of the dictionary offset in data array 620 would not exist. On an eviction, this choice might delay the decrementing of the reference count associated with the dictionary by causing a serialized subsequent access to tag array 610.

Figure 7:
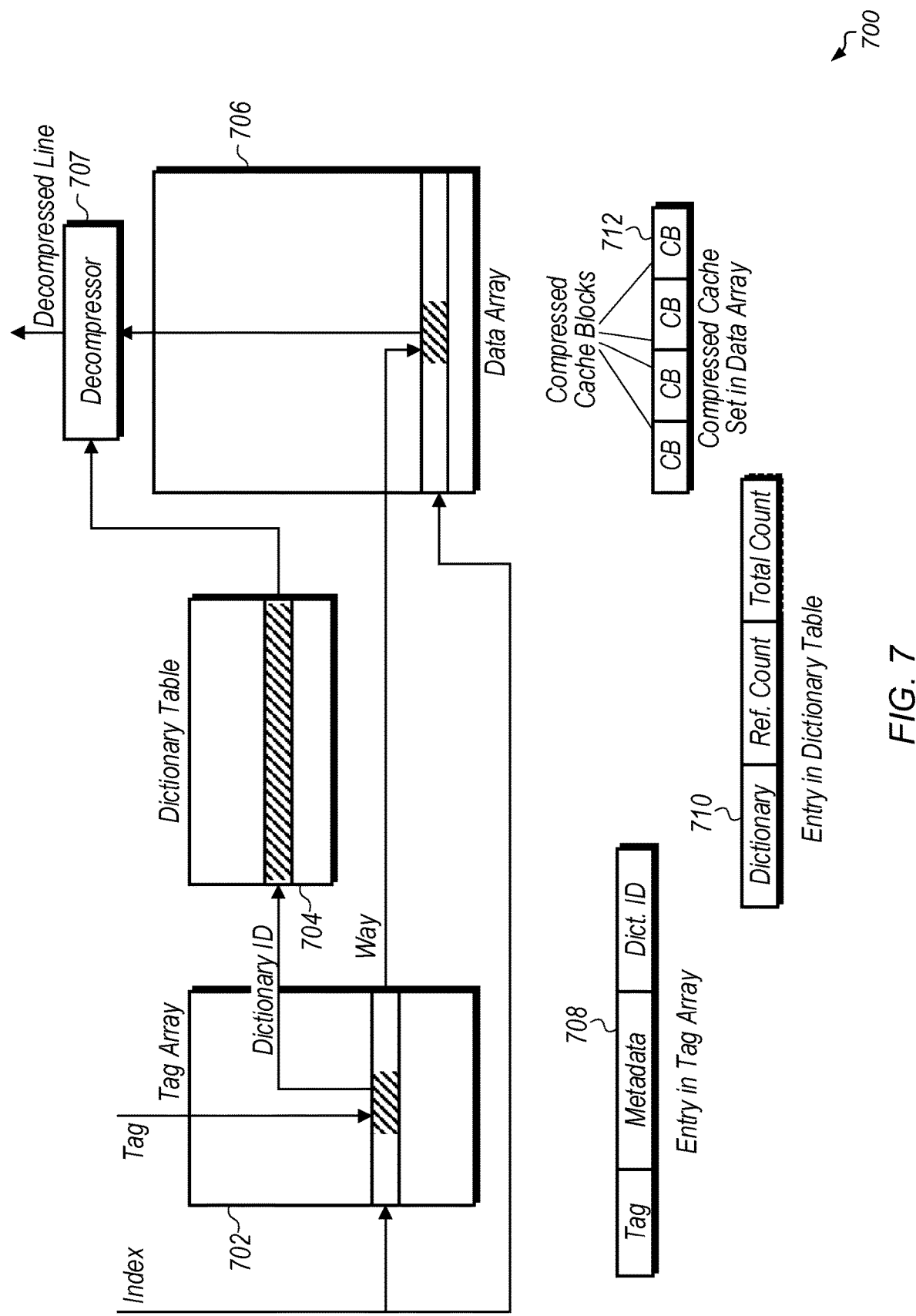
FIG. 7 is a block diagram of one implementation of a compressed cache.

Turning now to FIG. 7, a block diagram of one implementation of a compressed cache 700 is shown. Compressed cache 700 illustrates another example of using dictionaries in a flexible manner to achieve greater compression compared to traditional non-flexible approaches. In one implementation, the components of compressed cache 700 are included within one or more of the levels of cache subsystem 115 (of FIG. 1). In compressed cache 700, dictionary table 704 stores dictionaries which are used to compress and decompress cache lines stored in data array 706. It is noted that in compressed cache 700, dictionary table 704 is not stored in the data array 706 but rather is stored separately from data array 706.

Dictionary table 704 includes any number of entries, with the number of entries varying from implementation to implementation. Entry 710 includes a dictionary and a reference count to keep track of the number of cache lines stored in data array 706 that have been compressed using this dictionary. Entry 710 is one example of the format of a dictionary table entry in accordance with one implementation. Entry 710 also optionally includes a total count field to keep track of the history of the total number of cache lines that have been compressed with this dictionary. For example, while the reference count is reduced when a cache line which was compressed with this dictionary is evicted or invalidated from compressed cache 700, the total count would not be reduced. In one implementation, the total count field is used when determining which dictionary entry to replace when there are multiple dictionary entries that have a reference count of zero. For example, the dictionary entry that has the lowest total count out of all of the available dictionary entries is the entry which is replaced in one implementation. Accordingly, the dictionary entries are ranked according to the total count field to determine which dictionaries have data patterns which have been frequently encountered in the past. In another implementation, the individual entries of the dictionaries are ranked according to the number of times they have been referenced by pointer fields in compressed cache lines. In this implementation, new dictionaries are created by combining the highest ranked individual entries from multiple different dictionaries that are due to be replaced (i.e., those dictionaries with a reference count of zero). Note that some implementations may store a lossy approximation of the total count to save area and power.

When a lookup of compressed cache 700 is performed, a subset of address bits (i.e., an index) from the targeted address is used to locate a corresponding entry in tag array 702 and a corresponding set in data array 706. Entry 708 is one example of the format of a tag array entry in accordance with one implementation. As shown in FIG. 7, entry 708 includes a tag field, metadata field, and dictionary ID field. Set 712 represents one example of a set of data array 706, with set 712 including any number of compressed cache blocks.

When the lookup to tag array 702 results in a tag match between the queried tag and the tag stored in the entry, a dictionary ID is retrieved from the matching entry. Then, the dictionary ID is used to retrieve a corresponding dictionary from dictionary table 704. Also, an identification of the matching way of tag array 702 is conveyed to data array 706 to indicate the way from which to retrieve a compressed cache block. This compressed cache block and the retrieved dictionary are provided to decompressor 707. Decompressor 707 uses this dictionary to decompress the compressed cache block and generate the original data. In another implementation, groups of tags within tag array 702 share a single dictionary ID field rather than having one such field per tag. In this implementation, the different fields are stored in separate arrays. For example, dictionary IDs are stored separately from the tag and metadata.

In one implementation, when a cache line is being allocated in compressed cache 700, control logic (not shown) determines which dictionary to use for compressing the cache line. The control logic (e.g., a selector unit) selects any number of dictionaries from dictionary table 704 for comparing the amount of compression achieved for the cache line. The number of dictionaries that are selected for comparison purposes can vary according to the implementation. When the selector unit selects a dictionary for compressing the cache line, the dictionary ID of this dictionary is stored in the dictionary ID field of the corresponding entry in tag array 702. Also, the reference count is incremented in the entry of dictionary table 704 corresponding to the selected dictionary.

In one implementation, when a given cache line is evicted from compressed cache 700 or invalidated, the entry for the dictionary which was used to compress the given cache line is located. Then, the reference count for this dictionary table entry is decremented. If the reference count for this dictionary table entry is now equal to zero, then the dictionary table entry can be reclaimed. In one implementation, a new dictionary is stored in the table to replace this dictionary that has just had its reference count decremented to zero. In one implementation, the new dictionary is generated or selected based on the likelihood that the data patterns it contains will match the data patterns in cache lines being written to compressed cache 700. In some implementations, a dictionary table entry with a reference count equal to zero is lazily reclaimed at a later point in time.

In another implementation, compressed cache 700 includes multiple dictionary arrays for sub-regions or slices of compressed cache 700 to improve scalability and reduce latency. In addition, multiple dictionaries which perform compression at differing granularities can be employed. For instance, one array of dictionaries can store dictionaries that replace two-byte sequences of a cache line with code words while another array of dictionaries can replace sixteen-byte sequences of a cache line with code words. In some variants, the multiple dictionary arrays will have variable length reference counting fields. In some cases, real data is typically highly skewed (e.g., follows a Zipf distribution) so some dictionaries are likely to be much more commonly employed than others. Thus, those dictionaries predicted to be used more often than others are placed in entries with wider reference counter fields.

In another implementation, compressed cache 700 stores an array of dictionary entries rather than an array of dictionaries. In this implementation, a single cache line can be compressed with any combination of dictionary entries instead of several fixed combinations of dictionary entries. For this implementation, each dictionary entry includes a reference count which indicates how many cache line chunks are compressed with this entry.

Since dictionaries from dictionary table 704 can be shared among multiple cache lines, threads that do not belong to the same address space could potentially read or modify the state of another thread. Accordingly, in one implementation, before or during a dictionary access, the cache logic prevents threads from different address spaces from reading or modifying other threads' dictionaries unless the threads have been granted adequate permission. In some implementations, an owning thread or Address Space Identifier is associated with a given dictionary. In such an implementation, the owning party specifies the permissions associated with the dictionary. The owning party can enable or disable other threads from being able to share the dictionary and the owning party can specify the nature of the sharing. The cache logic ensures that updates to the dictionary on behalf of any thread do not corrupt or disallow recovery of data when decompressing associated cache lines.

In some implementations, one or more Address Space Identifiers are associated with a hardware thread and its associated dictionaries. Two or more hardware threads can have Address Space Identifier sets that completely, partially, or wholly overlap. For each operation performed by the cache logic on behalf of a thread, the cache logic checks that the Address Space Identifiers and the permission sets are sufficient to allow the access. In some implementations, threads from different address spaces will be able to share one or more dictionaries. In other implementations, sharing can be strictly disallowed between address spaces to reduce information leakage. In one implementation, cache partitioning is used to map threads from different address spaces to different partitions and disallow dictionary sharing across partition boundaries. In some implementations, this partitioning can be delegated to the operating system or privileged software by using page coloring or by using way-based or set-based cache partitioning.

In one implementation, the contents of dictionary table 704 form part of the hardware context of one or more threads. In an implementation without address space identifiers, dictionary table 740 is flushed on context switches and written back to memory or to a non-transient hardware structure (e.g., a specialized cache or scratchpad). When the thread's context is switched back in, the thread's dictionaries are reinstalled in dictionary table 704. In another implementation, one or more Address Space Identifiers are associated with each of the dictionaries in dictionary table 704. In this implementation, on a context switch, dictionary state no longer needs to be flushed. In a further implementation, one or more Address Space Identifiers are associated with each dictionary stored in the data array 512 of compressed cache 500 (of FIG. 5). In this implementation, these one or more Address Space Identifiers are used to prevent the need to flush compressed caches on context switches. Other implementations can fully or selectively flush the dictionaries of compressed cache 500 on a context switch.

Figure 8:
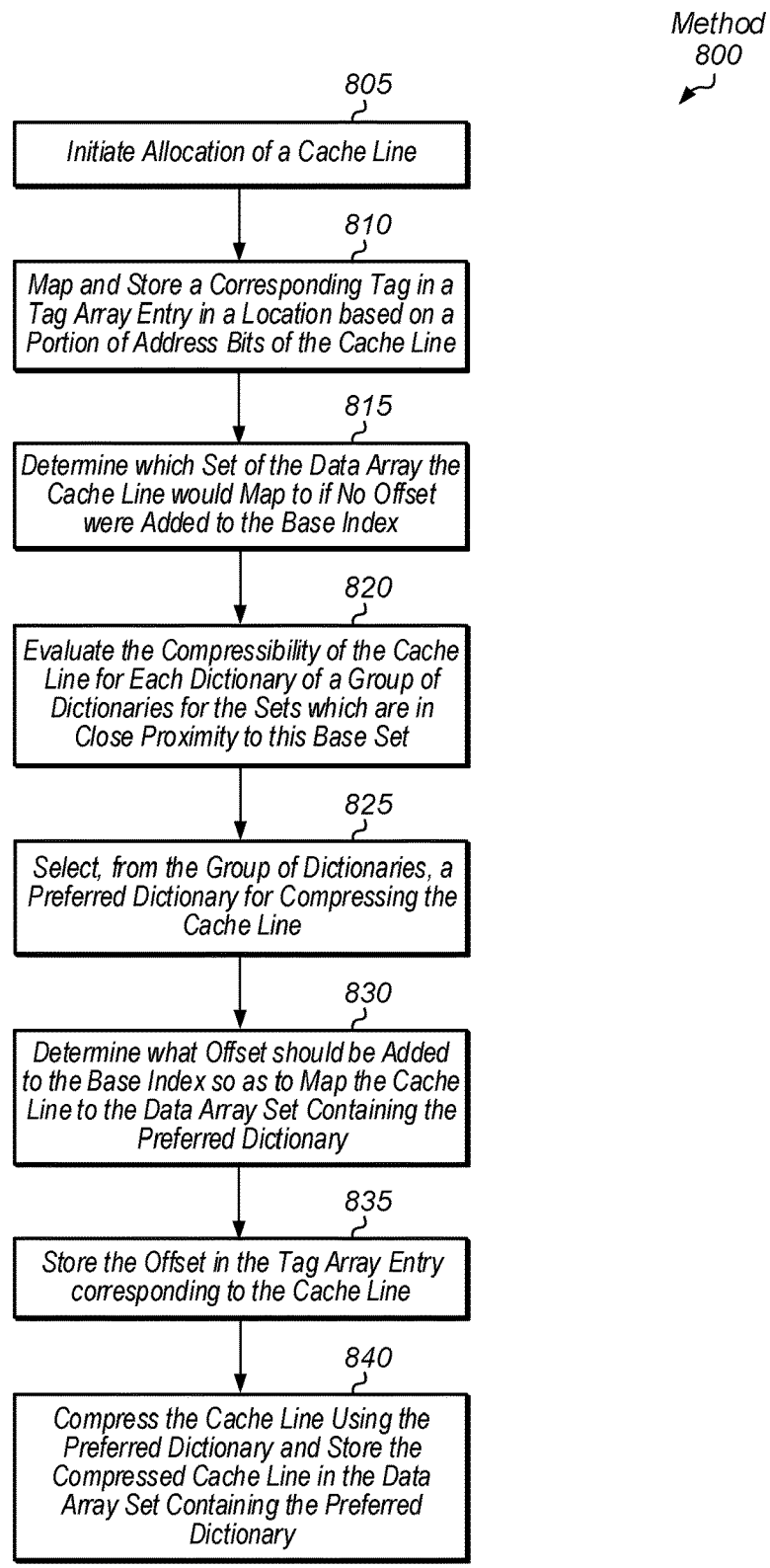
FIG. 8 is a generalized flow diagram illustrating one implementation of a method for flexible dictionary sharing in a compressed cache.

Referring now to FIG. 8, one implementation of a method 800 for flexible dictionary sharing in a compressed cache is shown. For purposes of discussion, the steps in this implementation and those of FIG. 9-14 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 800.

A compressed cache initiates allocation of a cache line (block 805). In response to initiating allocation of the cache line, the compressed cache maps and stores a corresponding tag in a tag array entry in a location based on a portion of address bits of the cache line (block 810). This portion of address bits can be referred to as a "base index". Then, the compressed cache determines which set of the data array the cache line would map to if no offset were added to the base index (block 815). Next, the compressed cache evaluates the compressibility of the cache line for each dictionary of a group of dictionaries for the sets which are in close proximity to this base set (block 820). The number of dictionaries in the group which are in close proximity can vary from implementation to implementation. In one implementation, the boundaries of what constitutes the close proximity of sets are determined based on the number of bits of the offset which is used to adjust the mapping of the cache line to the data array.

Then, the compressed cache selects, from the group of dictionaries, a preferred dictionary for compressing the cache line (block 825). In one implementation, the preferred dictionary is the dictionary which achieves the most compression for the cache line among the group of dictionaries subject to one or more constraints. It is noted that in some embodiments the preferred dictionary may not be the dictionary that achieves the most compression for the cache line. For example, in some cases the preferred dictionary may be chosen based on a desired balance between overhead required to perform the compression and a current workload. As an example, the dictionary which achieves the second most compression for the cache line might be chosen as the preferred dictionary rather than the dictionary which achieves the most compression for the cache line if a more aggressive compression algorithm is currently undesirable in view of the current workload of the system. In other cases, different and/or additional factors may be considered when choosing a preferred dictionary. For example, if one of the dictionaries achieves a lower level of (e.g., the second most) compression but also improves another metric (e.g., cache hit ratio), then that dictionary is chosen as the preferred dictionary in various embodiments. These and other embodiments are possible and are contemplated. In another implementation, the preferred dictionary is a dictionary which achieves at least a threshold amount of compression for the cache line. The value of the threshold can vary from implementation to implementation. It is noted that in some cases, none of the dictionaries will achieve at least a threshold amount of compression for the cache line. In these cases, method 800 can end and the cache line is stored in an uncompressed state.

After block 825, the compressed cache determines what offset should be added to the base index so as to map this cache line to the data array set containing the preferred dictionary (block 830). Then, the compressed cache stores this offset in the tag array entry corresponding to the cache line (block 835). Next, the compressed cache compresses the cache line using the preferred dictionary and stores the compressed cache line in the data array set containing the preferred dictionary (block 840). After block 840, method 800 ends.

Figure 9:
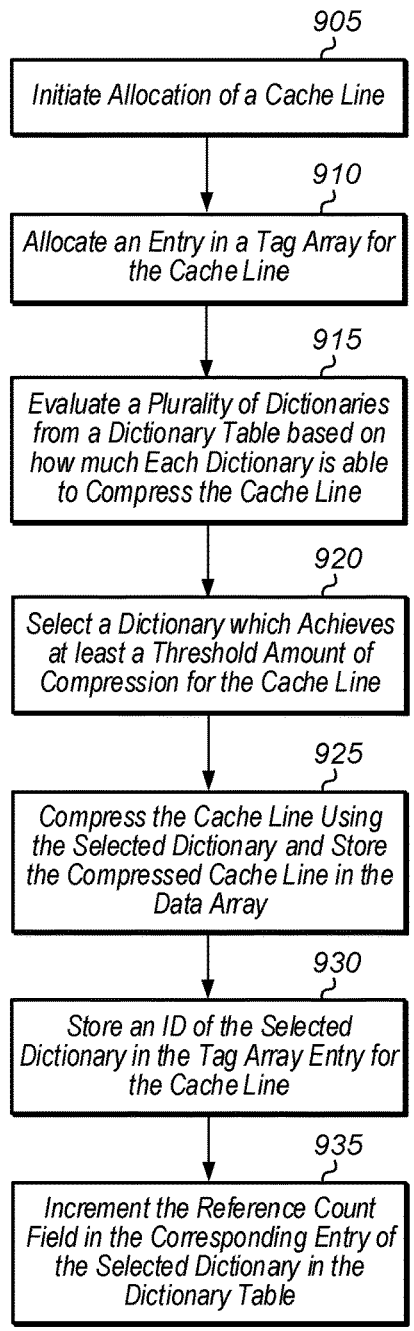
FIG. 9 is a generalized flow diagram illustrating one implementation of a method for implementing a dictionary selector unit for a compressed cache.

Turning now to FIG. 9, one implementation of a method 900 for implementing a dictionary selector unit for a compressed cache is shown. A compressed cache initiates allocation of a cache line (block 905). In one implementation, the compressed cache includes a tag array, a data array, and control logic (e.g., a cache controller) for implementing a dictionary selector unit. Next, the compressed cache allocates an entry in the tag array for the cache line (block 910). Then, the dictionary selector unit evaluates a plurality of dictionaries from a dictionary table based on how much each dictionary is able to compress the cache line (block 915). In one implementation, the dictionary selector unit determines which dictionary achieves the most compression for the cache line, and then the dictionary selector unit selects this dictionary for compressing the cache line. Next, the dictionary selector unit selects a dictionary which achieves at least a threshold amount of compression for the cache line (block 920). If the cache line is unable to be compressed to a particular size by any of the dictionaries, then the compressed cache can choose not to compress the cache line and method 900 ends.

After block 920, the compressed cache compresses the cache line using the selected dictionary and stores the compressed cache line in the data array (block 925). In one implementation, the compressed cache stores the compressed cache line in the data array in a set which corresponds to the location of the entry in the tag array for the cache line. Also, the compressed cache stores an ID of the selected dictionary in the tag array entry for the cache line (block 930). Still further, the compressed cache increments the reference count field in the corresponding entry of the selected dictionary in the dictionary table (block 935). After block 935, method 900 ends.

Figure 10:
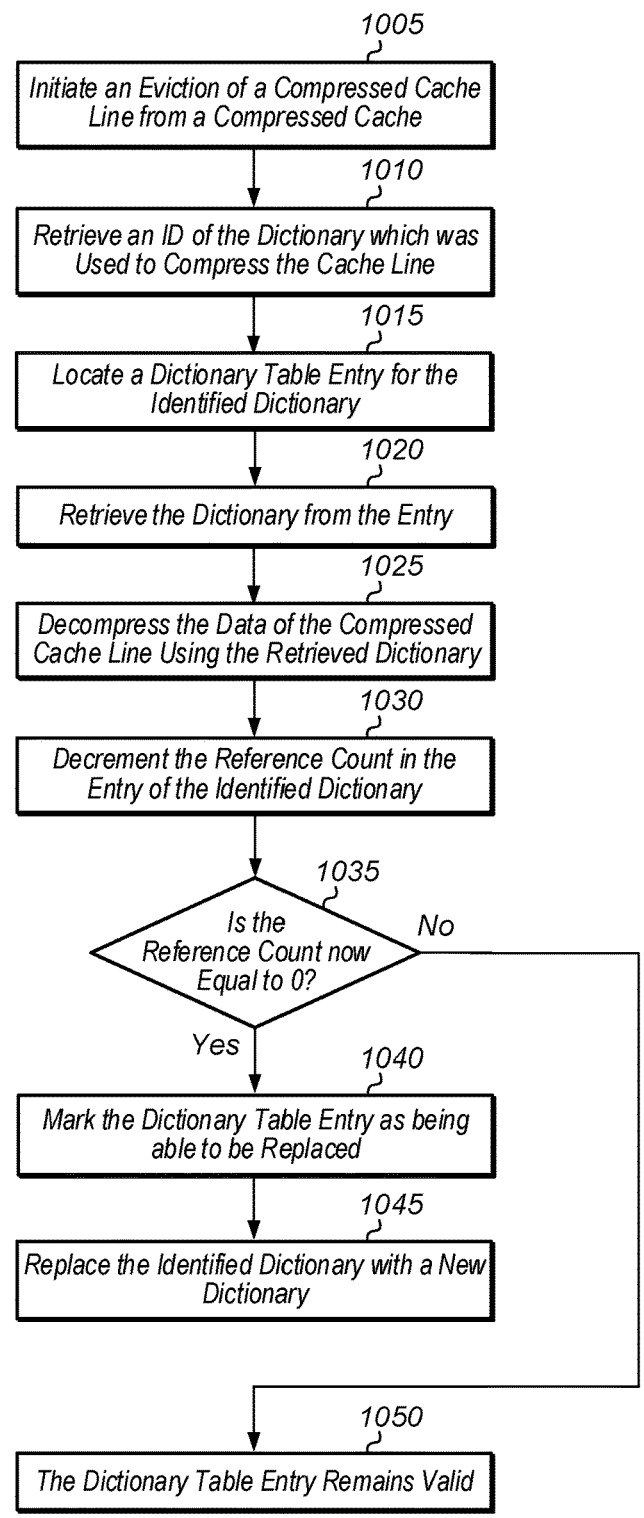
FIG. 10 is a generalized flow diagram illustrating one implementation of a method for processing an eviction from a compressed cache.

Turning now to FIG. 10, one implementation of a method 1000 for processing an eviction from a compressed cache is shown. An eviction of a compressed cache line from a compressed cache is initiated (block 1005). In response to initiating the eviction of the cache line from the compressed cache, the compressed cache retrieves an ID of the dictionary which was used to compress the cache line (block 1010). In one implementation, the compressed cache retrieves, from a corresponding tag array entry, an ID of the dictionary which was used to compress the cache line. Next, the compressed cache locates a dictionary table entry for the identified dictionary (block 1015). Then, the dictionary is retrieved from the entry (block 1020). Next, the compressed cache decompresses the data of the compressed cache line using the retrieved dictionary (block 1025). The decompressed data can then be written back to a lower-level cache or to memory. In some cases, if the data is going to be discarded, block 1025 can be skipped.

Also, the cache controller decrements the reference count in the dictionary table entry of the identified dictionary (block 1030). If after being decremented, the reference count for the dictionary table entry of the identified dictionary is now equal to zero (conditional block 1035, "yes" leg), then the dictionary table entry is marked as being able to be replaced (block 1040). Next, the cache controller replaces the identified dictionary with a new dictionary (block 1045). It is noted that the amount of time that elapses between blocks 1040 and 1045 can vary according to the implementation. Also, it is noted that the "new" dictionary can actually be a previously used dictionary. After block 1045, method 1000 ends. In some cases, if a new cache line is compressed with the identified dictionary after block 1040 is performed but before block 1045 is performed, then the dictionary table entry will not be replaced since its reference count is non-zero once again. If after being decremented, the reference count for the dictionary table entry of the identified dictionary is still greater than zero (conditional block 1035, "no" leg), then the dictionary table entry remains valid (block 1050). After block 1050, method 1000 ends.

Figure 11:
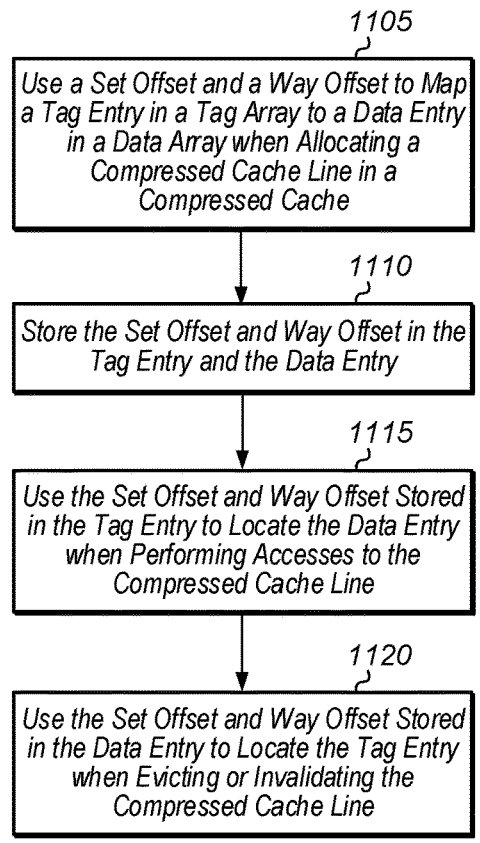
FIG. 11 is a generalized flow diagram illustrating one implementation of a method for mapping a tag entry location to a corresponding data entry location.

Referring now to FIG. 11, one implementation of a method 1100 for mapping a tag entry location to a corresponding data entry location is shown. Control logic uses a set offset and a way offset to map a tag entry in a tag array to a data entry in a data array when allocating a compressed cache line in a compressed cache (block 1105). The control logic stores the set offset and way offset in the tag entry and the data entry (block 1110). Later, the control logic uses the set offset and way offset stored in the tag entry to locate the data entry when accessing the compressed cache line (block 1115). Also, the control logic uses the set offset and way offset stored in the data entry to locate the tag entry when evicting or invalidating the compressed cache line (block 1120). After block 1120, method 1100 ends. By using method 1100, the control logic has more flexibility in finding a suitable dictionary for compressing cache lines.

Figure 12:
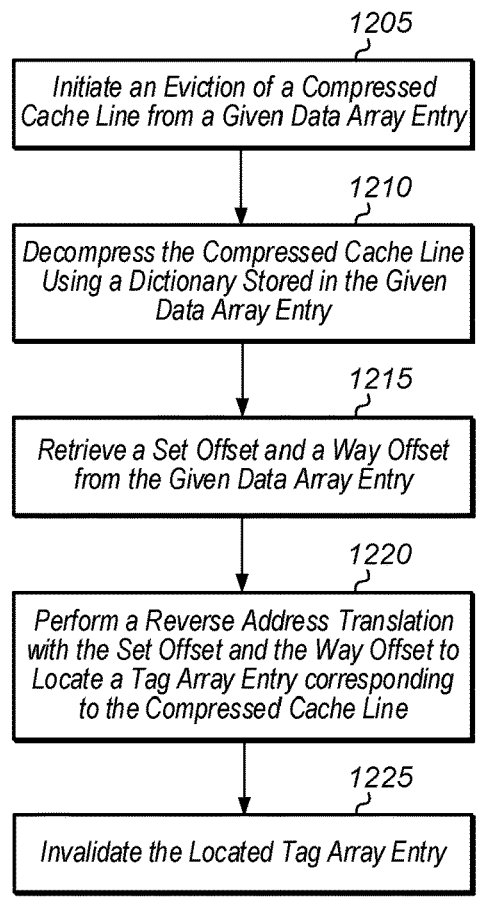
FIG. 12 is a generalized flow diagram illustrating one implementation of a method for evicting a compressed cache line from a compressed cache.

Turning now to FIG. 12, one implementation of a method 1200 for evicting a compressed cache line from a compressed cache is shown. An eviction (or invalidation) of a compressed cache line from a given data array entry is initiated (block 1205). The compressed cache line is decompressed using a dictionary stored in the given data array entry (block 1210). In some cases, block 1210 can be skipped if the data is being discarded. Also, a set offset and a way offset are retrieved from the given data array entry (block 1215). Next, a reverse address translation is performed with the set offset and the way offset to locate a tag array entry corresponding to the compressed cache line (block 1220). One example of performing a reverse address translation using a set offset and a way offset is described in method 1300 (of FIG. 13). Then, the located tag array entry is invalidated (block 1225). After block 1225, method 1200 ends.

Figure 13:
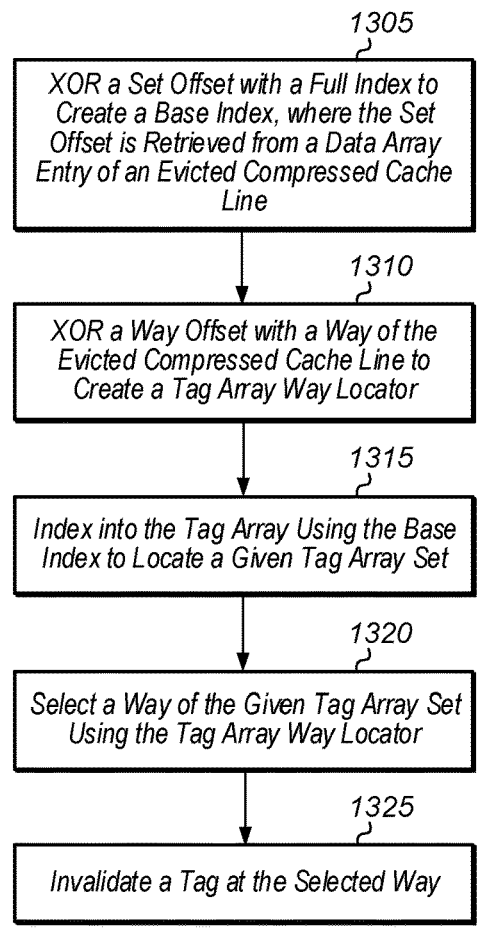
FIG. 13 is a generalized flow diagram illustrating one implementation of a method for performing a reverse address translation.

Referring now to FIG. 13, one implementation of a method 1300 for performing a reverse address translation is shown. A set offset is XOR'd with a full index to create a base index, where the set offset is retrieved from a data array entry of an evicted (or invalidated) compressed cache line (block 1305). The full index is the index of the data array set of the evicted (or invalidated) compressed cache line. A way offset is XOR'd with a way of the evicted compressed cache line to create a tag array way locator (block 1310). Control logic indexes into the tag array using the base index to locate a given tag array set (block 1315). Next, the control logic selects a way of the given tag array set using the tag array way locator (block 1320). Then, the control logic invalidates a tag at the selected way (block 1325). After block 1325, method 1300 ends.

Figure 14:
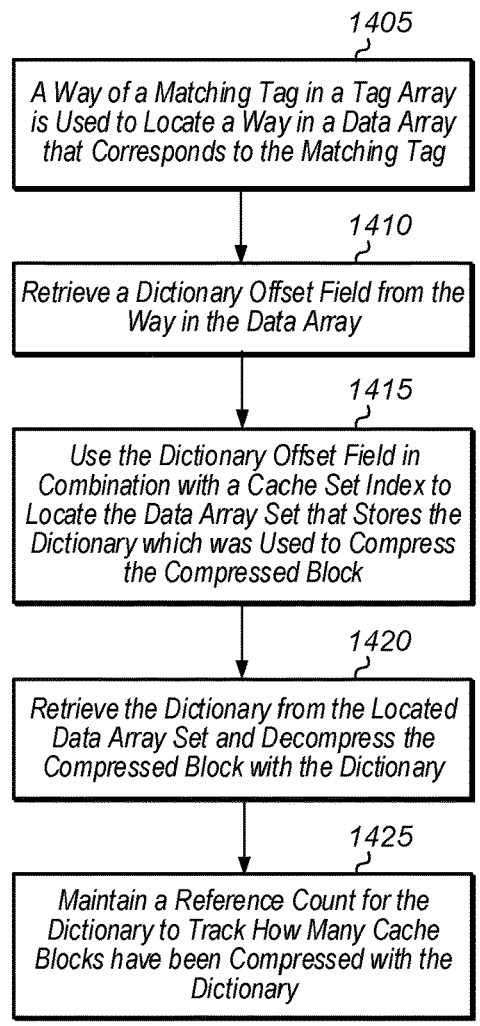
FIG. 14 is a generalized flow diagram illustrating one implementation of a method for using a dictionary offset field in a compressed cache.

Turning now to FIG. 14, one implementation of a method 1400 for using a dictionary offset field in a compressed cache is shown. A way of a matching tag in a tag array is used to locate a way in a data array that corresponds to the matching tag (block 1405). A dictionary offset field is retrieved from the way in the data array (block 1410). The dictionary offset field is used in combination with a cache set index to locate the data array set that stores the dictionary which was used to compress the compressed block (block 1415). In one implementation, the dictionary offset field is XOR'd with the cache set index to index into the data array. Next, the dictionary is retrieved from the located data array set and the compressed block is decompressed with the dictionary (block 1420). Also, a reference count is maintained for the dictionary to track how many cache blocks have been compressed with the dictionary (block 1425). After block 1425, method 1400 ends.

In various implementations, program instructions of a software application are used to implement the methods and/or mechanisms described herein. For example, program instructions executable by a general or special purpose processor are contemplated. In various implementations, such program instructions can be represented by a high level programming language. In other implementations, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (HDL) such as Verilog can be used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:
1. An apparatus comprising:
a cache comprising a plurality of entries; and
circuitry configured to:
receive data to be allocated in the cache;
select an entry in the cache to store the data;
select a preferred dictionary stored in the cache for compressing the data;

compress the data with the preferred dictionary to create compressed data;

store, in the entry, the compressed data and an identification of a location of the preferred dictionary in the cache, wherein the entry corresponds to a first set of the cache and the preferred dictionary is stored in a second set of the cache different from the first set of the cache.

2. The apparatus as recited in claim 1, wherein the cache is a set-associative cache.

3. The apparatus as recited in claim 1, wherein the circuitry is further configured to generate the identification of the location of the preferred dictionary in a manner that causes a modification, using the identification, of a first mapping that points to the entry that stores the compressed data to generate a second mapping that points to another entry that stores the preferred dictionary.

4. The apparatus as recited in claim 3, wherein the modification comprises performing a logical exclusive OR operation with the identification of the location of the preferred dictionary and the first mapping.

5. The apparatus as recited in claim 3, wherein based on a detection of an eviction of the compressed data, the circuitry is further configured to:

retrieve, from the entry, the compressed data and the identification of the location of the preferred dictionary;

modify, using the identification of the location of the preferred dictionary, the first mapping to generate the second mapping; and decrement a reference count stored in an entry identified by the second mapping, wherein the reference count indicates a number of entries that store compressed data that have been compressed by the preferred dictionary.

6. The apparatus as recited in claim 3, wherein based on a receipt of an access request targeting the compressed data, the circuitry is further configured to:

select the entry based on an address of the access request;

retrieve, from the entry, the compressed data and the identification of the location of the preferred dictionary;

modify, using the identification of the location of the preferred dictionary, the first mapping to generate the second mapping; and decompress the compressed data using the preferred dictionary stored in an entry identified by the second mapping.

7. The apparatus as recited in claim 3, wherein:

the plurality of entries is arranged as a plurality of sets including the first set of the cache and the second set of the cache;

the first mapping points to the first set; and the second mapping points to the second set.

8. A method comprising:

receiving, by circuitry of a cache, data to be allocated in the cache;

selecting, by the circuitry, an entry in the cache to store the data;

selecting, by the circuitry, a preferred dictionary stored in the cache for compressing the data;

compressing, by the circuitry, the data with the preferred dictionary to create compressed data; and storing, in the entry, the compressed data and an identification of a location of the preferred dictionary in the cache, wherein the entry corresponds to a first set of the cache and the preferred dictionary is stored in a second set of the cache different from the first set of the cache.

9. The method as recited in claim 8, further comprising incrementing a reference count stored in the location of the preferred dictionary in the cache, wherein the reference count indicates a number of entries that store compressed data that have been compressed by the preferred dictionary.

10. The method as recited in claim 8, further comprising generating the identification of the location of the preferred dictionary in a manner that causes a modification, using the identification, of a first mapping that points to the entry that stores the compressed data to generate a second mapping that points to another entry that stores the preferred dictionary.

11. The method as recited in claim 10, further comprising performing the modification by performing a logical exclusive OR operation with the identification of the location of the preferred dictionary and the first mapping.

12. The method as recited in claim 10, wherein based on a detection of an eviction of the compressed data, the method further comprises:

retrieving, from the entry, the compressed data and the identification of the location of the preferred dictionary;

modifying, using the identification of the location of the preferred dictionary, the first mapping to generate the second mapping; and decrementing a reference count stored in an entry identified by the second mapping, wherein the reference count indicates a number of entries that store compressed data that have been compressed by the preferred dictionary.

13. The method as recited in claim 10, wherein based on a receipt of an access request targeting the compressed data, the method further comprises:

selecting the entry based on an address of the access request;

retrieving, from the entry, the compressed data and the identification of the location of the preferred dictionary;

modifying, using the identification of the location of the preferred dictionary, the first mapping to generate the second mapping; and decompressing the compressed data using the preferred dictionary stored in an entry identified by the second mapping.

14. The method as recited in claim 10, wherein:

the cache comprises a plurality of entries arranged as a plurality of sets;

the first mapping points to a first set of the plurality of sets; and the second mapping points to a second set of the plurality of sets different than the first set.

15. A system comprising:

a cache;

a processor configured to generate access requests targeting data stored in the cache; and wherein the cache comprises:

a plurality of entries; and circuitry configured to:

receive data to be allocated in the cache;

select an entry in the cache to store the data;

select a preferred dictionary stored in the cache for compressing the data;

compress the data with the preferred dictionary to create compressed data;

store, in the entry, the compressed data and an identification of a location of the preferred dictionary in the cache, wherein the entry corresponds to a first set of the cache and the preferred dictionary is stored in a second set of the cache different from the first set of the cache.

16. The system as recited in claim 15, wherein the circuitry is further configured to increment a reference count stored in the location of the preferred dictionary in the cache, wherein the reference count indicates a number of entries that store compressed data that have been compressed by the preferred dictionary.

17. The system as recited in claim 15, wherein the circuitry is further configured to generate the identification of the location of the preferred dictionary in a manner that causes a modification, using the identification, of a first mapping that points to the entry that stores the compressed data to generate a second mapping that points to another entry that stores the preferred dictionary.

18. The system as recited in claim 17, wherein based on a detection of an eviction of the compressed data, the circuitry is further configured to:
   retrieve, from the entry, the compressed data and the identification of the location of the preferred dictionary;
   modify, using the identification of the location of the preferred dictionary, the first mapping to generate the second mapping; and
   decrement a reference count stored in an entry identified by the second mapping, wherein the reference count indicates a number of entries that store compressed data that have been compressed by the preferred dictionary.

19. The system as recited in claim 17, wherein based on a receipt of an access request targeting the compressed data, the circuitry is further configured to:
   select the entry based on an address of the access request;
   retrieve, from the entry, the compressed data and the identification of the location of the preferred dictionary;
   modify, using the identification of the location of the preferred dictionary, the first mapping to generate the second mapping; and
   decompress the compressed data using the preferred dictionary stored in an entry identified by the second mapping.

20. The system as recited in claim 17, wherein:
   the plurality of entries is arranged as a plurality of sets;
   the first mapping points to a first set of the plurality of sets; and
   the second mapping points to a second set of the plurality of sets different than the first set.

* * * * *